United States Patent
Zoellick et al.

(10) Patent No.: US 6,275,047 B1
(45) Date of Patent: Aug. 14, 2001

(54) CAPACITANCE MEASUREMENT

(75) Inventors: Raymond D. Zoellick, Bothell; Douglas A. Miller, Stevenson, both of WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/267,504

(22) Filed: Mar. 12, 1999

(51) Int. Cl.⁷ .................................................. G01R 27/26
(52) U.S. Cl. ........................................... 324/678; 324/548
(58) Field of Search .................................... 324/548, 658, 324/659, 677, 678

(56) References Cited

U.S. PATENT DOCUMENTS 5,880,589 * 3/1999 Okano .................................... 324/548
6,043,665 * 3/2000 Nishioka et al. .................... 324/678
6,191,723 * 2/2001 Lewis .................................... 324/678

* cited by examiner

*Primary Examiner*—Safet Metjahic
*Assistant Examiner*—J Kerveros
(74) *Attorney, Agent, or Firm*—George T. Noe

(57) ABSTRACT

An improved capacitance measurement system employs a selectable constant current source which is switched into a capacitor in a charge measurement system. The capacitor produces a linear ramp voltage in response to the constant current. An analog-to-digital converter (ADC) measures the change in voltage along the ramp over a corresponding change in time. These values, together with the value of constant current, are used to calculate the capacitance. In the preferred embodiment, a multi-slope ADC is utilized for the measurement. This system offers a wide range of measurable capacitance, and is fast responding and accurate. In addition, visual feedback to the user on measurement progress can be provided, which is particularly advantageous when measuring large capacitors.

10 Claims, 2 Drawing Sheets

CAPACITANCE MEASUREMENT

BACKGROUND OF THE INVENTION

This invention relates generally to measurement of capacitance, and in particular to improved measurement of capacitance using a constant current source in a charge measurement system.

Prior art methods of measuring capacitance have included capacitance bridges and other precision instrumentation that is usually complex and expensive. In U.S. Pat. No. 5,073,757 to Richard E. George and assigned to Fluke Corporation, a method of measuring small capacitances was disclosed in which an unknown capacitor was discharged and then fully charged through a reference resistor, while at the same time a current proportional to the charging current was accumulated on the storage capacitor of a dual-slope analog-to-digital converter (ADC). The charge was then removed over a period of time dictated by the amount of stored charge, and the time was measured to give an indication of capacitance value. Because the capacitor had to fully charge within the integrating cycle of the dual slope ADC, that is, the capacitor had to charge for at least five RC time constants, only small capacitance values, e.g., on the order of five microfarads or less, could be measured.

This limitation was immediately recognized, resulting in the system disclosed in U.S. Pat. No. 5,136,251 to Richard E. George et al. and assigned to Fluke Corporation. Rather than attempting to charge the unknown capacitor in one cycle of a dual-slope integrating ADC, the capacitor was at least partially discharged and then charged over a multiplicity of ADC cycles. On each successive ADC cycle, referred to as "minor cycles" since the measurement was incomplete until the final ADC cycle, the amount of charge stored on the ADC's storage capacitor for that cycle was measured while the accumulated charge on the unknown capacitor built up to the fully charged condition. On each minor cycle of the ADC, when the measurement for that cycle was made the charging current to the unknown capacitor was suspended. The ADC stored progressively less charge on the storage capacitor for each successive minor cycle because the RC charge curve of the unknown capacitor began to flatten out, but the end result was to accumulate the full charge over a number of ADC cycles.

The drawbacks to these prior art capacitance measurement techniques include inordinately long measurement times because the unknown capacitor has to charge fully. This is particularly annoying when determining the value of large capacitors because the measuring instrument appears "dead" to the user during slow measurements. Also, relying on RC time constants results in inaccuracies because the RC charge curve becomes asymptotic in approaching the final voltage. This is particularly true for measuring large capacitors because the RC charge curve is broken into progressively smaller pieces.

Another factor making capacitance measurements difficult, particularly in hand-held digital multimeters, is that dual slope ADCs are being replaced by other, faster ADCs, such as multislope ADCs. Dual slope ADCs integrate an unknown quantity, such as voltage, over a fixed period of time, and then in what is known as a "de-integrate cycle" measure the length of time it takes to remove the integrated and stored quantity. Multislope ADCs exhibit faster measurements because the dynamic range of the integrated and stored quantity (voltage) being measured is reduced, with known charge being added or removed during the integrate cycle to keep the accumulated quantity within a narrow input window. This of course results in a substantially reduced "de-integrate cycle" in which the final quantity is measured and algebraically summed with the known added or subtracted charge. Often the voltage charge curve required to fully charge an unknown capacitor in order to make an accurate measurement either is not compatible with the timing and mechanics of the ADC integrate cycle, or the voltage is outside the dynamic window of the ADC. An example of a multislope ADC is disclosed in U.S. Pat. No. 5,321,403 to Benjamin Eng, Jr., et al. and assigned to Fluke Corporation.

SUMMARY OF THE INVENTION

In accordance with the present invention, an improved capacitance measurement system employs a selectable constant current source that is switched into the unknown capacitor, creating a linear ramp charge voltage rather than the exponential curve of the prior art. Since the value of capacitance is equal to the charge stored on the capacitor divided by the voltage across the capacitor, or $C=Q/V$, and the charge is equal to the current flowing into the capacitor over a period of time, or $Q=IT$, the value of capacitance may be computed if V, T, and I are all known. The constant current I is predetermined, and hence, known. An analog-to-digital converter (ADC) measures the change in voltage along the ramp over a corresponding change in time. These values, together with the value of constant current, are used to calculate the capacitance.

In the preferred embodiment, a multislope integrating ADC is utilized for the measurement. This system offers a wide range of measurable capacitance, and is fast responding and accurate. In addition, visual feedback to the user on measurement progress can be provided, which is particularly advantageous when measuring large capacitors.

It is therefore one object of the present invention to provide an improved capacitance measurement method and apparatus.

It is another object of the present invention to provide an improved capacitance measurement system capable of measuring a wide range of capacitance values.

It is a further object of the present invention to provide a capacitance measurement system in which differential voltage and time values are measured from a linear ramp voltage produced by delivering a constant current to the capacitor being measured.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
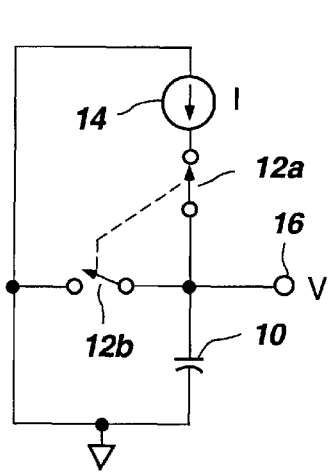
FIG. 1 is a schematic diagram showing charge and discharge circuits for a capacitor whose value is being measured.
Figure 2:
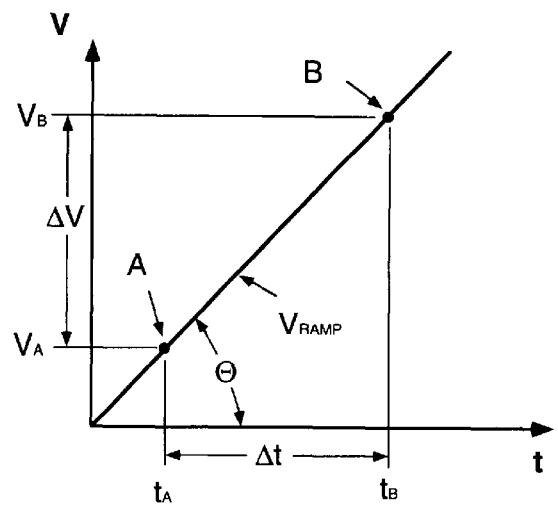
FIG. 2 shows the resultant voltage with respect to time during the charging of the capacitor of FIG. 1.

FIGS. 1 and 2 are provided to aid in understanding the principles of the present invention. FIG. 1 is a schematic diagram showing charge and discharge circuits for a capacitor 10. When switch 12a is closed (and switch 12b open), a constant current source 14 is connected in series with a capacitor 10 to charge the capacitor. When switch 12a is open (and switch 12b closed), capacitor 10 discharges. As capacitor 10 charges, a voltage V is developed across the capacitor, and since one side of the capacitor is referenced to ground, this voltage V is produced at terminal 16. It is well known to those skilled in the art that a constant current I flowing into a capacitor produces a linear voltage ramp $V_{RAMP}$ because the capacitor integrates the non-varying current over time. FIG. 2 shows the resultant voltage with respect to time as ramp voltage $V_{RAMP}$. Of course, the slope of the ramp, indicated by angle θ, is determined by the quantity of current and size of the capacitor. Assuming that the value of the capacitor is fixed, the angle θ may be increased or decreased by increasing or decreasing the amount of current I. As current I is increased, the ramp becomes steeper because the capacitor simply takes less time to charge. By selecting any two points A and B on the voltage ramp $V_{RAMP}$, voltages $V_A$ and $V_B$, and corresponding times $t_A$ and $t_B$, can readily be discerned. Thus, $V_B-V_A=\Delta V$ and $t_B-t_A=\Delta t$ can be determined. Since the value of capacitance C is equal to the amount of charge Q on the capacitor divided by voltage across the capacitor, or C=Q/V, and Q=i t, then C=IΔt/ΔV, where I is the value of constant current.

Figure 3:
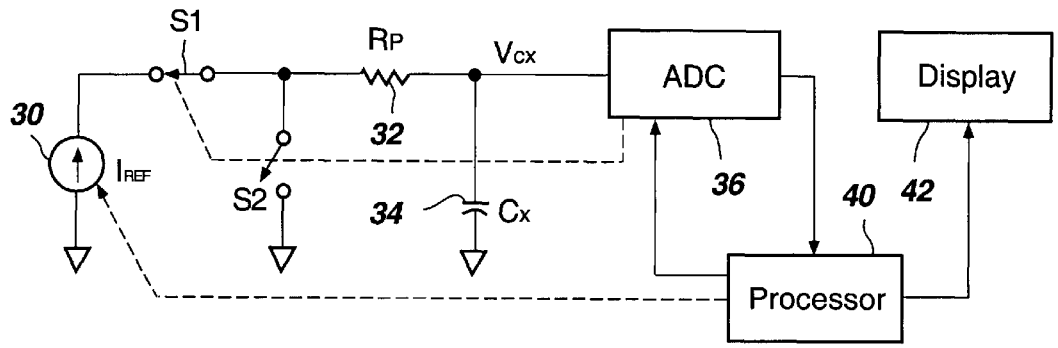
FIG. 3 shows an improved capacitance measurement circuit in accordance with the present invention.

Referring now to FIG. 3 of the drawings, there is shown an improved capacitance measurement circuit in accordance with the present invention wherein a selectable constant current source 30 is connected via a switch S1 and protection resistor 32 to a capacitor 34 having an unknown value $C_x$. A second switch S2 is connected from the junction of switch S1 and protection resistor 32 to ground. For measuring small capacitors, switches S1 and S2 are complementary, meaning that when one switch is open, the other is closed, and vice versa. However, as will be discussed later, for measuring large capacitors, these switches may be operated independently. These switches suitably may be electronic switches, as is well known in the art. The junction of resistor 32 and capacitor 34 is coupled to the input of an analog-to-digital converter (ADC) 36. The output of ADC 36 is coupled to a processor 40. Processor 40 includes a controller section which provides control signals to determine the mode of operation of switches S1 and S2, and to ADC 36, which controls the operation of the capacitance measurement circuit in first and second operating states. Processor 40 also processes the output of ADC 36, computes the capacitance value of $C_x$, and provides a resultant output to display 42 or to internal storage for later use. In addition, since the value of capacitance $C_x$ initially is unknown, processor 40 controls the angle of the linear ramp voltage as discussed earlier by selection of the value of current from constant current source 30. This function can be either operator selectable, depending upon the expected capacitance value, or can be automatically selected in an auto-ranging process.

ADC 36 in the preferred embodiment is a multi-slope integrating analog-to-digital converter, such as that disclosed in U.S. Pat. No. 5,321,403. As such, ADC 36 may suitably include an ADC state machine for controlling operation of input switching to the ADC in integrate (STATE 1) and de-integrate and hold (STATE 2) cycles and for keeping track of charge added and subtracted during the integrate cycle. The multi-slope integrating ADC is preferred because it has the benefits of fast, accurate operation, of keeping voltage swings to a minimum, and of programmable integrate periods that can be set over a wide range.

However, those having ordinary skill in the art will appreciate from an understanding of the concept and principles of the present invention that other types of ADCs may alternatively be used, such as flash converters or dual-slope integrating ADCs. For purposes of this discussion, it will be assumed in the description that ADC 36 is an integrating ADC.

The circuit of FIG. 3 operates as follows: Assume that initially capacitor 34 is at least partially discharged, and that switch S1 is opened and switch S2 is closed. With switch S2 closed, capacitor 34 has a discharge path through resistor 32 and switch S2. When capacitor 34 reaches a stable initial voltage, ADC 36 measures the voltage $V_{cx}$. Processor 40 instructs the ADC 36 to initiate a capacitance measurement. The ADC 36 switches to the first operating state, which, in this discussion, is the integrate cycle, sending a STATE 1 control signal to close switch S1 (and open switch S2). With switch S1 closed, constant current source 10 is coupled via resistor 32 to capacitor 34, causing capacitor 34 to charge linearly. ADC 36 begins to accumulate a charge on its internal storage (integrate) capacitor. The integrate cycle of ADC 36 is a selectable known period of time that may be chosen to eliminate the effects of 50 and 60 hertz noise induced from power lines and lighting. For example, an integrate period of 100 milliseconds (an exact multiple of 20 milliseconds for 50 hertz, or an exact multiple of 16.667 milliseconds for 60 hertz) will eliminate the effects of power-line induced noise. It can be discerned by those skilled in the art that multiples or submultiples of 100 milliseconds may be used to lengthen or shorten the integrate period to accommodate a wide range of capacitance values.

When the integrate cycle of ADC 36 is complete, the state machine of ADC 36 issues control signals to switches S1 and S2, and switch S1 is opened. For measuring small capacitors, switch S2 is also closed upon completion of the integrate cycle, allowing capacitor 34 to discharge while ADC 36 operates in its de-integrate cycle. Then, ADC 36 waits in its hold state for a trigger or command from processor 40 to start another measurement cycle. For measuring large capacitors, switch S2 remains open following completion of an integrate cycle, holding the charge on capacitor 34 during the de-integrate (and hold) cycle of ADC 36 because for large capacitors it is preferable to charge capacitor 34 over several integrate cycles of ADC 36.

Since in this description ADC 36 is an integrating ADC, only one-half the value of $V_{cx}$ will be measured. That is, the linear ramp voltage $V_{cx}$ is integrated, and so the voltage stored in the ADC's storage capacitor is $V_{cx}/2$. Thus it will be necessary to multiply the final measured voltage value by a factor of two when calculating the value of capacitance. For non-integrating ADCs, such as flash converters, the peak voltage of $V_{cx}$ of the capacitor 34 may be measured directly, from which the initial voltage is subtracted to obtain the ΔV value.

At the end of the de-integrate cycle of ADC 36, processor 40 calculates the value of capacitance. Since the value of constant current $I_{REF}$ is known, the time period Δt is known, and the capacitance voltage $V_{cx}$, or ΔV, has been measured, capacitance may be calculated for an integrating ADC from the formula:

$$C = I_{REF} \Delta t / 2\Delta V \tag{1}$$

This value may suitably be displayed on a display device 42 or stored for later use, such as downloading to a computer.

Figure 4:
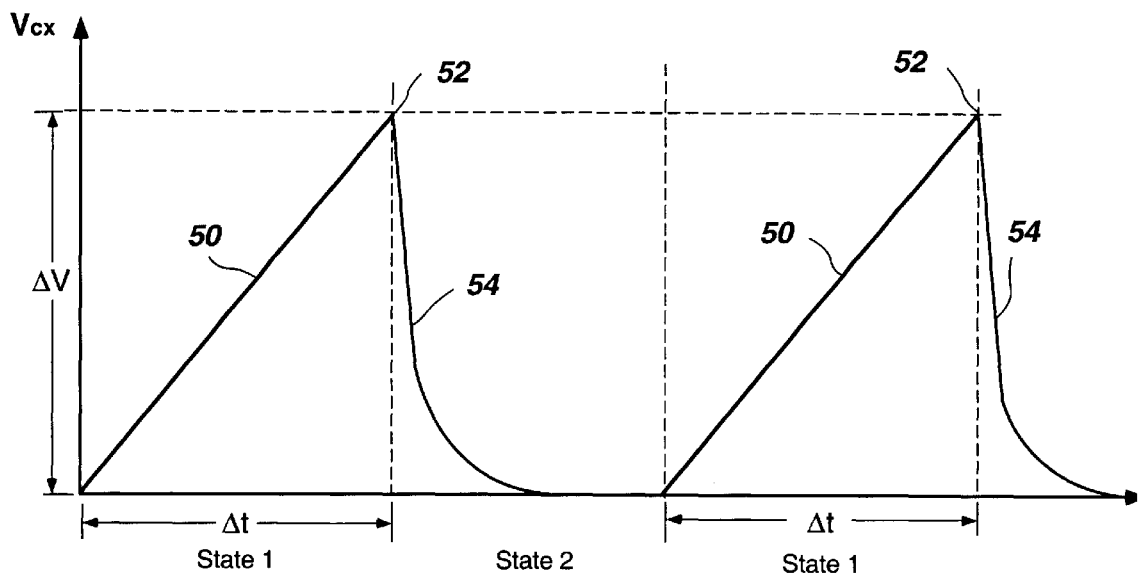
FIG. 4 shows the capacitance voltage waveform in accordance with the present invention for small capacitance measurements.

FIG. 4 shows the voltage waveform across capacitor 34 for small capacitance measurements. Two cycles of the charge/discharge operations are depicted. In STATE 1, voltage $V_{cx}$ across capacitor 34 increases linearly, creating a voltage ramp 50 which has a final value at peak 52. Capacitor 34 discharges through protection resistor 32 and switch S2 in STATE 2, creating the discharge waveform 54 as it decreases at an RC rate. In the embodiment described herein, protection resistor 32 has a value of approximately 5 kilohms. As discussed earlier, the slope of the ramp can be changed by selecting different values of constant current $I_{REF}$. Processor 40 may select different values on constant current in conjunction with an auto-ranging function, or the values of constant current may be selected by a user in conjunction with manual range switches. In the present invention, an optimum slope may be obtained by either selecting different values of constant current $I_{REF}$, or adjusting the integrate period, or a combination of both, to facilitate a wide range of measurable capacitance values. Also, several readings may be taken and averaged to provide enhanced accuracy in situations in which speed can be reduced.

Figure 5:
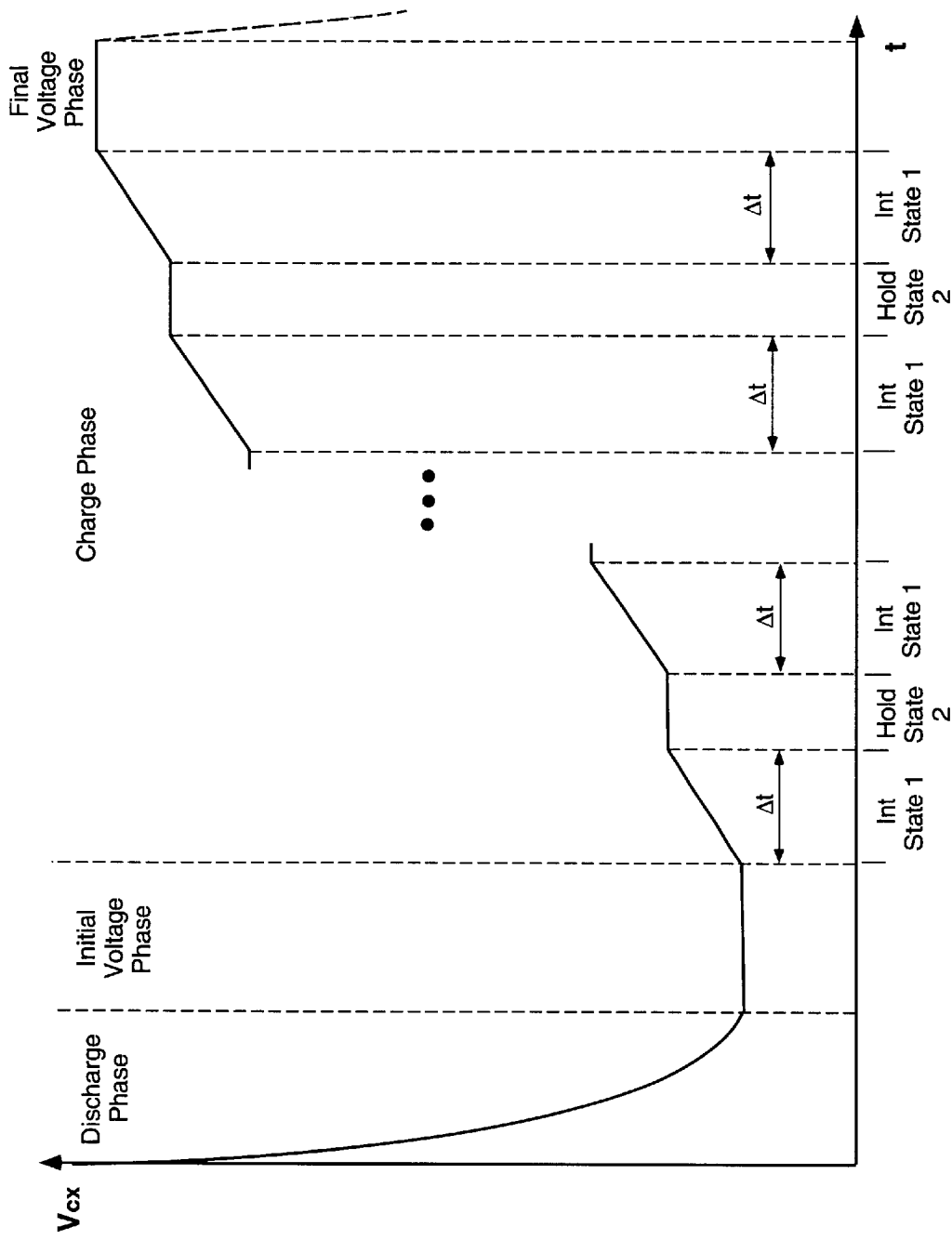
FIG. 5 shows the capacitance voltage waveform in accordance with the present invention for large capacitance measurements.

FIG. 5 shows the voltage waveform across capacitor 34 for large capacitance measurements. It can be readily discerned from the voltage waveform that the capacitor is going to be charged over several cycles of ADC 36 rather than one cycle. In a first phase, switch S1 is open, switch S2 is closed, and the large capacitor 34 is at least partially discharged through protection resistor 32 and closed switch S2. Then the state machine of ADC 36 (or processor 40, depending upon the actual system implemented) sends a control signal to open switch S2 (while switch S1 is also still open). This is the initial voltage phase in which the initial voltage $V_{cx}$ held on capacitor 34 is measured. Thereafter, the charging phase begins when processor 40 sends control signals to initiate an integrate cycle of ADC 36, with the state machine of ADC 36 also signaling that switch S1 close synchronously. With switch S1 closed (switch S2 is still open), constant current source 30 is connected to capacitor 34, which in turn begins to charge linearly. This state is indicated in FIG. 5 as INT STATE 1. At the end of the integrate cycle, the state machine of ADC 36 initiates a de-integrate cycle and sends a control signal to open switch S1 (switch S2 is still open). In this state, which is labeled HOLD STATE 2 in FIG. 5, the voltage $V_{cx}$ across capacitor 34 is held constant while the ADC 36 completes its de-integrate and measurement functions. This charge-and-hold process is repeated for a number of ADC cycles (sometimes referred to as measurement "minor" cycles) until the capacitor 34 is cyclically charged to a final voltage. Note that the time period $\Delta t$ for each integrate cycle is the same for every integrate cycle. During the final voltage phase, the final value of $V_{cx}$ is measured with both switches S1 and S2 open, and the value of $C_x$ is calculated using the following formula:

$$C_x = (I_{REF} n \Delta t)/(V_{cx,final} - V_{cx,inital}) \qquad (2),$$

where n is the number of integrate cycles. The ADC 36 and processor 40 may continue to provide readings after each complete measurement cycle wherein each measurement of $V_{cx}$ is averaged with preceding measurements, thus refining the measurement accuracy on each cycle.

The large-capacitance measurement system employing a multi-slope ADC makes it possible for a user to monitor the accumulated voltage $V_{cx}$ during the charge phase. As soon as the first measurement cycle is completed, a reading showing the accumulated voltage $V_{cx}$ may be displayed, with the value updated on subsequent measurement cycles. In addition, if the measuring instrument has a bar graph as part of the display, the increasing value of $V_{cx}$ can be displayed linearly with the bar graph being updated at the end of each integrate cycle. Also, a capacitance value may be calculated and a reading provided on the display even though the reading may be rough or inaccurate after the first measurement cycle, but will be refined on subsequent measurement cycles. These monitoring features permit immediate feedback to a user measuring large capacitances, overcoming the problem of waiting perhaps several seconds during an instrument "dead time" for some indication that the instrument is being responsive to the measurement. Also, the user can terminate the charging when $V_{cx}$ has reached some predetermined threshold, or when it appears the capacitance value $C_x$ is approaching an expected value. This allows the measurement to end as soon as possible rather than waiting for a complete measurement in situations where full accuracy is not important.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. A measurement system for determining the value of a capacitor, comprising:

a constant current source coupled to said capacitor, said constant current source delivering a known constant current to said capacitor to generate a linearly increasing voltage across said capacitor;

measurement means coupled to said capacitor for determining differential voltage and differential time values from at least a portion of said linearly increasing voltage; and a processor coupled to said measurement means for multiplying said differential time value by said known constant current and dividing by the differential voltage value to compute a capacitance value of said capacitor.

2. A measurement system in accordance with claim 1 wherein said measurement means includes an analog-to-digital converter.

3. A measurement system in accordance with claim 2 wherein said analog-to-digital converter includes a controller for selecting an initial point and a final point along said linearly increasing voltage.

4. A measurement system in accordance with claim 3 wherein said controller selects differential voltage and differential time values from plurality of substantially equal segments of said linearly increasing voltage.

5. A measurement system in accordance with claim 1 wherein said constant current source provides a plurality of selectable predetermined constant current values.

6. A measurement system for measuring the value of a capacitor, comprising:

a charge circuit including a constant current source connectable to said capacitor in a first operating state to produce a linearly increasing voltage ramp representing the charge on said capacitor;

measurement means coupled to said charge circuit for measuring a voltage difference and a time difference between a first point and a second point along said ramp in said first operating state;

a controller coupled to said charge circuit for connecting said current source to said capacitor in said first operating state and disconnecting said current source from said capacitor and causing said capacitor to discharge in a second operating state, said controller further coupled to said measurement means for controlling said measurement means in said first operating state and said second operating state; and a computation circuit coupled to said measurement means and responsive to said voltage difference and said time difference for computing the value of capacitance.

7. A measurement system in accordance with claim 6 wherein said measurement means comprises an analog-to-digital converter.

8. A measurement system in accordance with claim 6 wherein said measurement means comprises a integrating analog-to-digital converter wherein one-half of said voltage difference is accumulated on an internal storage capacitor, and said computation circuit multiplies said accumulated one-half of said voltage difference by a factor of two.

9. A measurement system in accordance with claim 8 wherein said integrating analog-to-digital converter measures voltage differences from a plurality of substantially equal segments of said linearly increasing voltage ramp.

10. A method of measuring the capacitance of a capacitor, comprising:

delivering to said capacitor a predetermined constant current, causing said capacitor to generate a linear voltage ramp thereacross;

measuring the voltage difference and time difference between two points on said linear voltage ramp; and computing a capacitance value of said capacitor by multiplying said predetermined constant current by said time difference and dividing by said voltage difference.

* * * * *